United States Patent [19]

Fujihara

[11] Patent Number: 5,089,871

[45] Date of Patent: Feb. 18, 1992

[54] INCREASED VOLTAGE MOS SEMICONDUCTOR DEVICE

[75] Inventor: Tatsuhiko Fujihara, Matsumoto, Japan

[73] Assignee: Fuji Electric Co., Ltd., Japan

[21] Appl. No.: 547,828

[22] Filed: Jul. 3, 1990

[30] Foreign Application Priority Data

Jul. 4, 1989 [JP] Japan .................................. 1-172740
Mar. 5, 1990 [JP] Japan .................................. 2-53084

[51] Int. Cl.$^5$ ...................... H01L 29/10; H01L 29/78; H01L 29/68; H01L 29/40
[52] U.S. Cl. .................................. 357/23.8; 357/23.4; 357/53; 357/86
[58] Field of Search ........................ 357/23.8, 23.4, 53, 357/86

[56] References Cited

U.S. PATENT DOCUMENTS 4,823,475  4/1989  Keasom ............................. 357/23.8
4,941,026  7/1990  Temple ............................. 357/23.8

Primary Examiner—J. Carroll
Attorney, Agent, or Firm—Brumbaugh, Graves, Donohue & Raymond

[57] ABSTRACT

The present invention relates to an increased operating voltage MOS semiconductor device. The device has a channel forming area between a source and extended drain area, a gate insulating film over the channel forming area and the drain area with a thicker portion over the drain area, and a gate electrode over the gate insulating film, thereby preventing an excess field concentration from existing in the extended drain region. The field concentration may be further reduced by forming a relaxation area underneath the juncture between the thick and thin portions of the gate insulating film below the surface of the drain area.

7 Claims, 3 Drawing Sheets

INCREASED VOLTAGE MOS SEMICONDUCTOR DEVICE

BACKGROUND OF THE INVENTION

The present invention relates to metal-oxide-semiconductor (MOS) devices, and particularly to metal-oxide-semiconductor devices capable of operating at higher voltages.

In many electrical applications MOS devices, like high voltage integrated circuits, smart power devices, MOSFETs, and integrated gate bipolar transistors (IGBTs), are used to operate under voltage control and facilitate control circuit design. These devices, in general, have a channel forming area at a surface layer of a semiconductor substrate and a MOS structure on the surface to form a channel forming area.

These MOS devices have a problem in that they cannot operate at high voltages. The reason is that when a voltage is applied across the drain electrode and the source electrode during the off state, a field concentration occurs at the drain layer leading to breakdown at low voltages. It is preferable, especially in high power applications, to utilize devices able to withstand higher voltages.

The present inventor has discovered a MOS device operable at significantly higher voltages that solves the prior art problem by preventing this field concentration from occurring.

It is therefore an object of the present invention to describe a metal-oxide-semiconductor device with a breakdown voltage higher than previously available.

SUMMARY OF THE INVENTION

In accordance with the present invention, there is described an increased operating voltage metal-oxide-semiconductor device comprising a channel forming area at a surface layer of the third area of the first conductivity type between the first and second areas of the second conductivity type individually connected to the electrodes on the surface layer of the semiconductor substrate, with a gate electrode through the thin gate insulating film on that channel forming area and with the thick field insulating film connected to the gate oxide film for insulation between the gate electrode and the semiconductor substrate, characterized in that the thickness of the field insulating film is 3 to 12 times more than the thickness of the gate oxide film.

Also, in accordance with the present invention, there is described an increased operating voltage metal-oxide-semiconductor device comprising a channel forming area at the surface layer of the third area of the first conductivity type between the first and second areas of the second conductivity type individually connected to the electrodes on the surface layer of the semiconductor substrate, with the gate electrode through the thin gate insulating film on that channel forming area and with the thick field insulating film connected to the ate oxide film for insulation between the gate electrode and the semiconductor, characterized in that the electric field relaxation layer of the first conductivity type is formed on the surface of the second area of the second conductivity type immediately below the level difference between the gate insulating film and the field insulating film.

For a better understanding of the present invention, together with other and further objects, reference is made to the following description, taken in conjunction with the accompanying drawings, and its scope will be pointed out in the appended claims.

DESCRIPTION OF THE PREFERRED EMBODIMENTS

Figure 1:
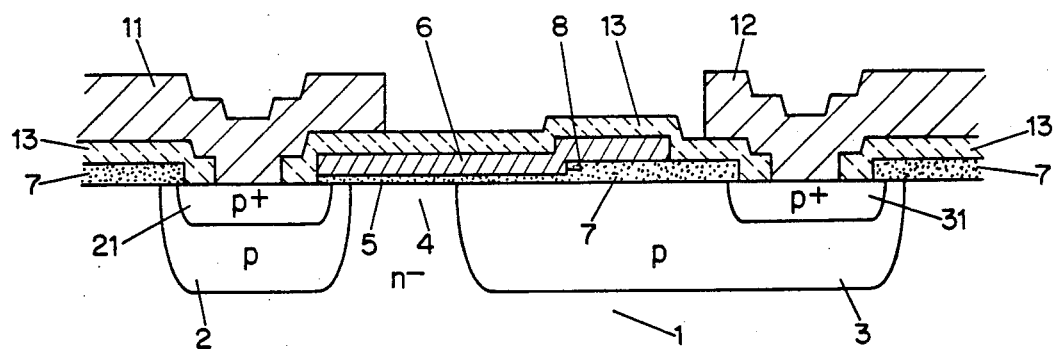
FIG. 1 is a sectional view of a lateral p-channel MOSFET in accordance with the present invention.

FIG. 1 illustrates one embodiment of an increased operating voltage MOS device in accordance with the invention, a lateral p-channel MOSFET. As illustrated in FIG. 1, a source area 2 of p type semiconductor material is connected to a source electrode 11, and a drain area 3, with extended length of p type conductivity type semiconductor material, is connected to drain electrode 12. A lightly doped n type semiconductor material I, also called the base layer, lies between the source and drain areas and includes a channel forming area 4 within a surface layer of the material. Over the channel forming area 4 is the gate electrode 6, insulated from the channel forming area by a gate oxide film 5. A portion 7 of the gate oxide film 5 near the channel forming area is thicker and insulates the semiconductor substrate from the gate electrode 6. The gate electrode 6 serves as a field plate by spreading over this thicker portion 7 of the gate oxide film, also called the thick field oxide. An insulating film 13 consisting of PSG and other components covers the gate electrode 6 in order to insulate the gate electrode from the source 11 and drain 12 electrodes.

A p+ source contact area 21 with high impurity concentration is formed at the connection between the source area 2 and the source electrode 11. Likewise, a p+ drain contact area 31 with high impurity concentration is formed at the connection between the drain area 3 and the drain electrode 12. Another embodiment in accordance with the invention is the integrated gate bipolar transistor. When a p channel is formed on the area 4 by changing the p+ drain contact area 31 to an n+ conductivity type semiconductor material, the above MOSFET becomes a lateral type IGBT which modulates the degree of conduction when holes are sent from the source area 2 to the drain area 3, allowing a large current to flow.

Figure 2:
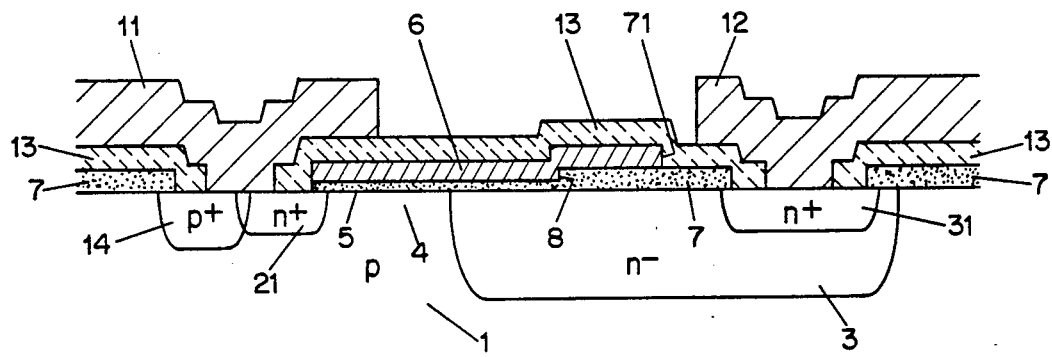
FIG. 2 is a sectional view of a lateral n-channel MOSFET in accordance with the present invention.

FIG. 2 shows another embodiment in accordance with the invention, a lateral n-channel MOSFET whose conductivity type is reverse to the conductivity type of the p-channel MOSFET illustrated in FIG. 1. The same labels are used in FIG. 2 for corresponding parts in FIG. 1. Besides the difference in conductivity types of the semiconductor components, there is an additional area of p+ conductivity 14 overlapping with the source contact area 21 and connected to the source electrode 11, short-circuiting the source to the base layer 1. There is no n type source area 2; instead the highly doped n+ source contact area 21 serves as a source area.

Figure 3:
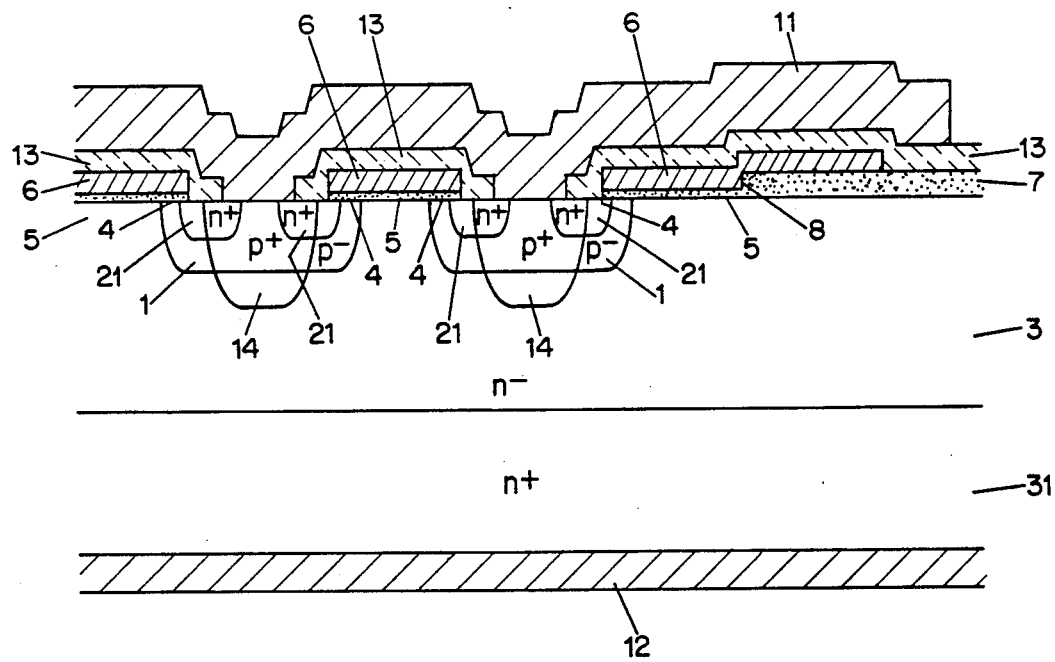
FIG. 3 is a sectional view of a vertical n-channel MOSFET in accordance with the present invention.

FIG. 3 illustrates another embodiment in accordance with the invention, a vertical type n-channel MOSFET with the same labels as given for corresponding parts in FIG. 2. The invention can also be embodied as a vertical n-channel IGBT be changing the n+ drain contact area 31 to p+ type conductivity semiconductor material.

Figure 4:
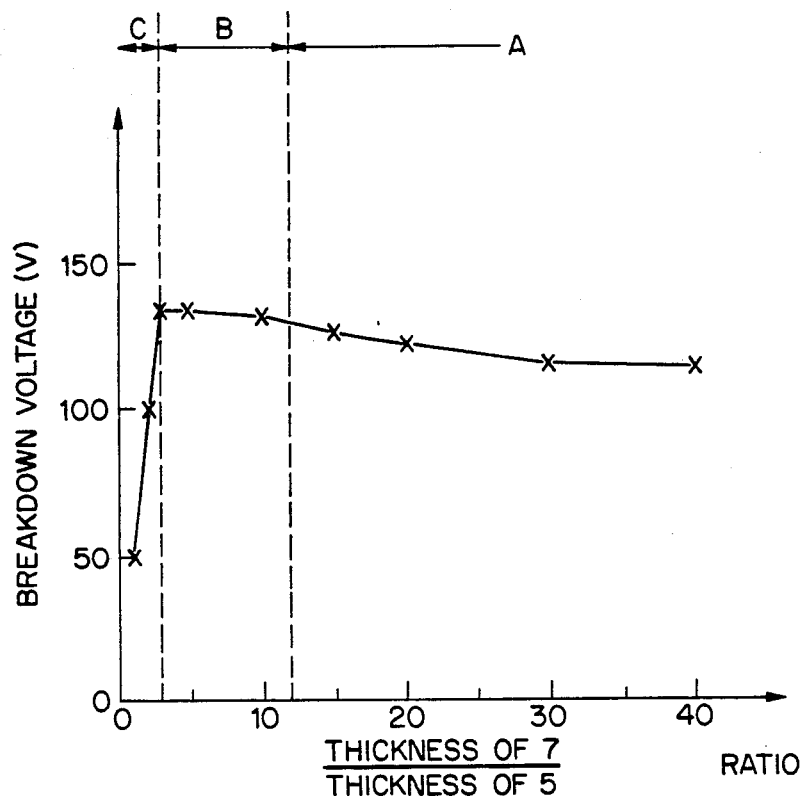
FIG. 4 is a diagram of the relationship between the breakdown voltage and the ratio of the field oxide film thickness to the gate oxide film thickness useful in describing the invention.

Useful in describing the invention's benefits over the prior art, FIG. 4 illustrates the changes in breakdown voltage between the drain layer 3 and the combination of source layer 21, base layer 1 and gate electrode 6 of the lateral n-channel MOSFET shown in FIG. 2 as related to the changes in the ratio of the thickness of the thicker portion 7 to the thinner portion 5 of the gate oxide film. In area A where that ratio is 12 times or more, the breakdown voltage begins to drop as the field oxide film 7 is thicker. This is caused by a field concentration within the drain area 3 immediately below the juncture between the thicker 7 and thinner 5 portions of the gate oxide film. In area C, where that ratio of thicknesses is three times or less, the breakdown is undesirably low. This is caused by the field concentration within the drain area 3 immediately below the end of the gate electrode near the drain area. The inventor has found that this field concentration adversely affecting the breakdown voltage can be prevented by setting the thickness ratio to some value in area B, namely to values in which the thick portion 7 of the gate oxide film is 3 to 12 times thicker than the thin portion 5.

As an example of the invention, in the lateral type n-channel MOSFET as shown in FIG. 2 with the thick portion of the gate oxide being 2500 angstroms thick and the thin portion being 500 angstroms thick, the breakdown voltage is 134 V. This is a marked improvement over the breakdown voltage of 123 V, typically available in the prior art, whereby a thick portion of gate oxide insulating a gate electrode may be 10000 angstroms thick. In the vertical type n-channel MOSFET shown in FIG. 3 with the thick portion of the gate oxide being 5000 angstroms thick and the thin portion being 500 angstroms, the breakdown voltage is 275 V. This is again an improvement over a breakdown voltage of 255 V, typically available with the prior art, whereby the thick portion may be of the order of 10000 angstroms thick.

Figure 5A:
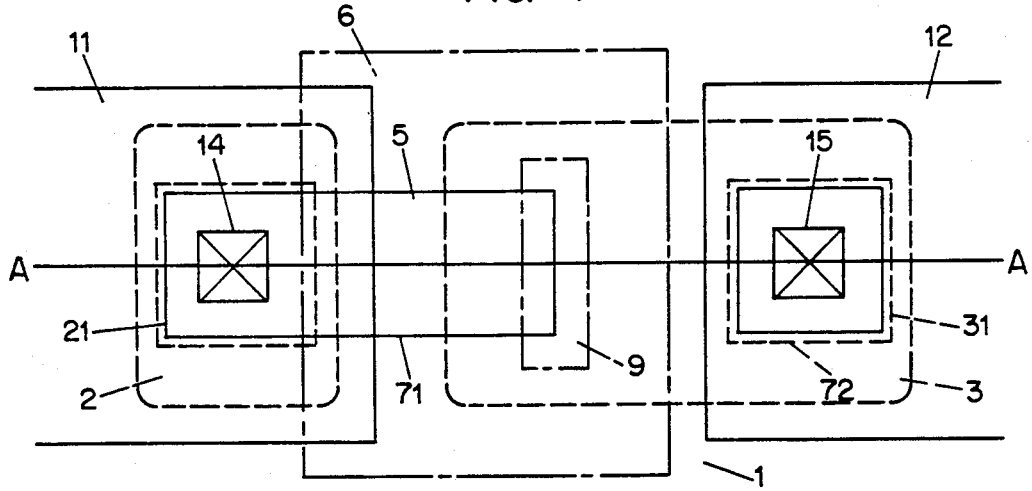
FIG. 5A and 5B are plan and sectional views of a lateral p-channel MOSFET in accordance with the present invention.
Figure 5B:
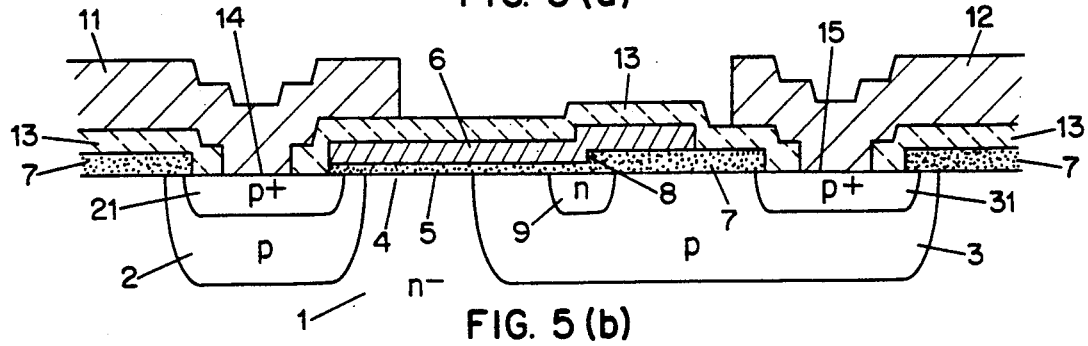

FIGS. 5A and 5B illustrate another embodiment of an increased operating voltage MOS device in accordance with the invention, a lateral n-channel MOSFET. FIG. 5A is the plan view, and FIG. 5B is the sectional view of the A—A line of FIG. 5A. The same labels as in FIG. 1 are used for elements corresponding to those in FIG. 1. In opening 14 of the insulating film 13, the source electrode 11 is in contact with the p+ source contact area 21. In opening 15, the drain electrode 12 is in contact with the p+ drain contact area 31. In addition to the elements mentioned above, a relaxation area 9 of n type conductivity semiconductor material is included below the surface of the drain area 3 immediately below the juncture between the thicker 7 and thinner portions 5 of the gate oxide film. Such an area can be formed by coating the surface of an n- silicon substrate with an oxide film mask to form p+ contact areas 21 and 31, then forming the relaxation area 9 through ion implantation of $1 \times 10^{12} - 5 \times 10^{12}$ doses/cm$^3$. The unwanted part of the thick oxide film may be removed to form a thin gate oxide film 5 on which polycrystal silicon can then be laminated and patterned to form the gate electrode 6.

Under operating conditions when a high voltage is applied across the source and the drain of the MOS semiconductor device during the off-state, the potential difference between the gate electrode 6 and the drain area 3 forms an inversional layer at the surface of the drain area opposite to the gate electrode over the thin portion 5 of the gate insulating film over the drain area. That inversional layer causes the relaxation layer 9, below the juncture between the thinner and thicker portions of the gate insulating film, to be at a potential difference equivalent to that of the base layer 1 including the channel forming area 4. Therefore, the field concentration below the juncture generated by the potential difference between the drain area 3 and the base layer 1 is relieved. As an example of the invention in a device with a base layer 3 ohm cm in resistivity, the withstand voltage is 140 V, compared with a conventional voltage of 60 V typically available to the knowledge of the inventor, with the on-resistance equal to the conventional value.

Figure 6:
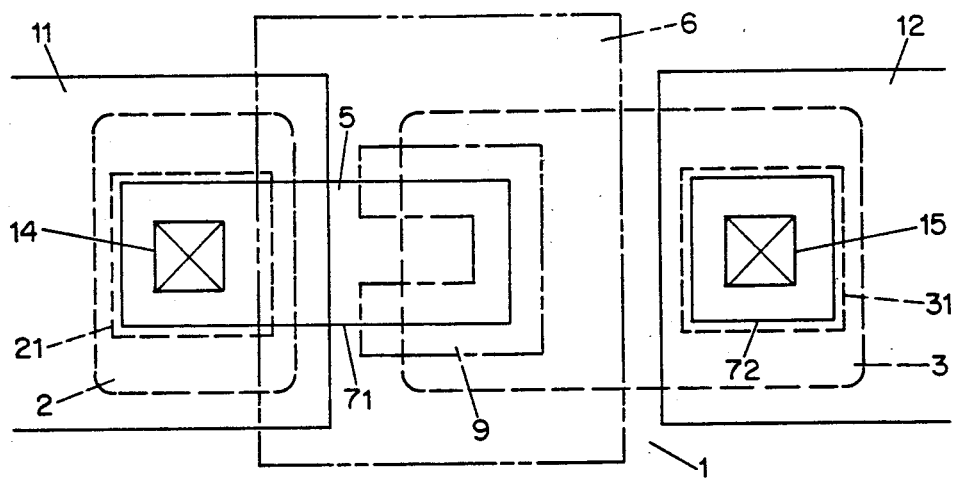
FIG. 6 and 7 are plan views of two variations based on the embodiment shown in FIGS. 5A and 5B.
Figure 7:
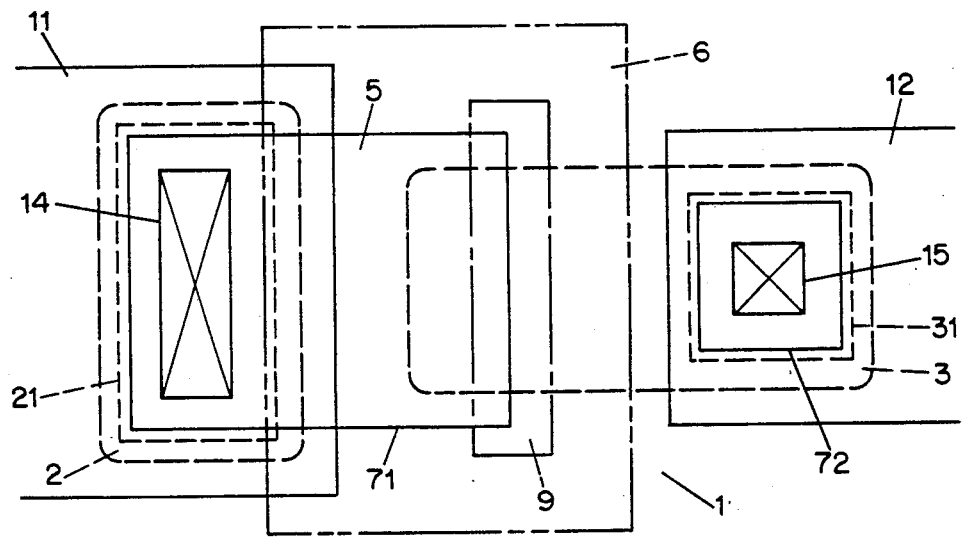

FIGS. 6 and 7 are plan views that show other variations based on the embodiment shown in FIGS. 5A and 5B. In both figures, the relaxation area 9 extends out of the range of the drain area 3 until it connects to the base layer 1. Therefore, the relaxation layer 9, which is illustrated as a float in FIG. 5, has the same electric potential as the base layer 1, and produces similar effects as the embodiment shown in FIG. 5.

Figure 8:
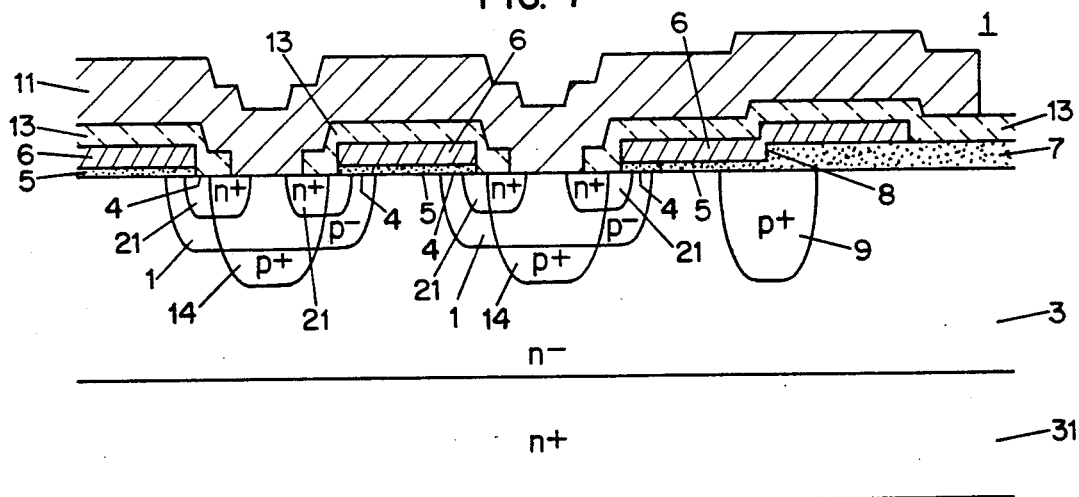
FIG. 8 is a sectional view of a vertical n-channel MOSFET in accordance with the present invention.

FIG. 8 illustrates an embodiment in accordance with the invention, the vertical n-channel MOSFET with the same labels as in FIG. 3 on the elements common to both. In this case, the relaxation layer 9 is of p+ type conductivity semiconductor material with high impurity concentration. It may be formed by impurity diffusion, for example with an average concentration of $1 \times 10^{18}$/cm$^3$ simultaneously with the p+ area 14 short-circuiting the source to the base layer 1. After the formation of the p+ areas, the gate oxide film 5 and the gate electrode 6 may be produced, finally conducting diffusion for the p— base layer 1 and the n+ contact areas 21 and 31.

With the same design approach described above for lateral and vertical MOSFETs, lateral and vertical IGBTs with improved operating voltages can be produced by using a different conductivity type for the drain contact area 31. The invention may also be embodied in a normally-on type MOS semiconductor device with the source area connected to the drain area through a layer of the same conductivity type as both source and drain areas. This layer may be formed at the surface of the base layer 1 immediately below the gate oxide film 5 between the source area 2 and the drain area 3.

While there have been described what are believed to be the preferred embodiments of the invention, those skilled in the art will recognize that other and further modifications may be made thereto without departing from the invention, and it is intended to claim all such changes and modifications as fall within the scope of the invention.

I claim:

1. An increased operating voltage metal-oxide semiconductor device comprising:

a source area of a first conductivity type semiconductor material connected to a source electrode;

a drain area, with extended length of a first conductivity type semiconductor material, connected to a drain electrode;

a second conductivity type semiconductor material between said source and drain areas, including a channel forming area within a surface layer of said material;

a gate insulating film, over said channel forming area, which extends over the drain area, said film having a first portion near the channel forming area and a second portion thicker near the drain electrode;

a gate electrode over said gate insulating film and including a portion extended over said second portion of the gate insulating film;

and a relaxation area of a second conductivity type semiconductor material within said drain area immediately below a juncture between said first and second portions of the gate insulating film and not extended laterally beyond said gate electrode;

whereby the relaxation area and the portion of said gate electrode extended over said second portion of the gate insulating film permit a greater operating voltage without breakdown by preventing an excess field concentration from existing in said drain area immediately below a juncture between said first and second portions of the gate insulating film.

2. An increased operating voltage metal-oxide-semiconductor device as in claim 1, wherein said relaxation layer is coupled to said second conductivity type semiconductor material between the source and the drain.

3. An increased operating voltage metal-oxide-semiconductor device as in claim 1, wherein:

said source area includes a source contact area of a first conductivity type semiconductor material with high impurity concentration at the connection between the source area and the source electrode;

and said drain area includes a drain contact area of a first conductivity type semiconductor material with high impurity concentration at the connection between the drain area and the drain electrode.

4. An increased operating voltage metal-oxide-semiconductor device as in claim 1, wherein:

said source area includes a source contact area of a first conductivity type semiconductor material with high impurity concentration at the connection between the source area and the source electrode;

and said drain area includes a drain contact area of a second conductivity type semiconductor material with high impurity concentration at the connection between the drain area and the drain electrode.

5. An increased operating voltage metal-oxide-semiconductor device as in claim 3, further comprising an area of second conductivity type semiconductor material with high impurity concentration overlapping with said source contact and connected to said source electrode.

6. An increased operating voltage metal-oxide-semiconductor device as in claim 4, further comprising an area of second conductivity type semiconductor material with high impurity concentration overlapping with said source contact and connected to said source electrode.

7. An increased operating voltage metal-oxide semiconductor device comprising:

a source area of a first conductivity type semiconductor material connected to a source electrode, said source area including a source contact area of a first conductivity type semiconductor material with high impurity concentration at the connection between the source area and the source electrode;

an area of second conductivity type semiconductor material with high impurity concentration overlapping with said source contact and connected to said source electrode;

a drain area, with extended length of a first conductivity type semiconductor material, connected to a drain electrode, said drain area including a drain contact area of a first conductivity type semiconductor material with high impurity concentration at the connection between the drain area and the drain electrode;

a second conductivity type semiconductor material between source and drain areas, including a channel forming area within a surface layer of said material;

a gate insulating film, over said channel forming area, which extends over the drain area, said film having a first portion near the channel forming area and a second portion at least three and less than approximately 12 times thicker near the drain electrode;

a gate electrode over said gate insulating film and including a portion extended over said second portion of the gate insulating film;

and a relaxation area of second conductivity type semiconductor material within said drain area immediately below a juncture between said first and second portions of the gate insulating film and not extended laterally beyond said gate electrode;

whereby the relaxation area and the portion of said gate electrode extended over said second portion of the gate insulating film permit a greater operating voltage without breakdown by preventing an excess field concentration from existing in the extended length of said drain area.

* * * * *

UNITED STATES PATENT AND TRADEMARK OFFICE
CERTIFICATE OF CORRECTION

PATENT NO. : 5,089,871
DATED : February 18, 1992
INVENTOR(S) : Tatsuhiko Fujihara It is certified that error appears in the above-identified patent and that said Letters Patent is hereby corrected as shown below:

Title page, item [56], "4,823,475" should read
--4,823,173--;

Title page, item [56], "Keasom" should read
--Beasom--;

Column 1, line 58, "ate" should read --gate--.

Signed and Sealed this

Thirteenth Day of July, 1993

Attest:

MICHAEL K. KIRK

Attesting Officer

Acting Commissioner of Patents and Trademarks